United States Patent [19]

Nakanishi

[11] Patent Number: 4,971,923

[45] Date of Patent: Nov. 20, 1990

[54] METHOD OF MAKING SEMICONDUCTOR DEVICE WITH DIFFERENT OXIDE FILM THICKNESSES

[75] Inventor: Shoji Nakanishi, Tokyo, Japan

[73] Assignee: Seiko Instruments Inc., Japan

[21] Appl. No.: 337,394

[22] Filed: Apr. 13, 1989

[51] Int. Cl.$^5$ .......................................... H01L 21/336
[52] U.S. Cl. ......................................... 437/52; 437/69
[58] Field of Search .................. 437/52, 69, 70, 72, 437/238, 239, 241, 242, 228; 156/657

[56] References Cited

U.S. PATENT DOCUMENTS

| | | | |
|---|---|---|---|
| 3,886,000 | 5/1975 | Bratter et al. | 437/70 |
| 4,352,236 | 10/1982 | McCollum | 437/52 |
| 4,624,046 | 11/1986 | Shideler et al. | 437/922 |

FOREIGN PATENT DOCUMENTS

| | | |
|---|---|---|
| 0032024 | 7/1981 | European Pat. Off. . |
| 0075875 | 4/1983 | European Pat. Off. . |
| 0178418 | 4/1986 | European Pat. Off. . |
| 0189795 | 8/1986 | European Pat. Off. . |
| 0298879 | 1/1989 | European Pat. Off. . |

OTHER PUBLICATIONS

Ghandhi, *VLSI Fabrication Principles* John Wiley & Sons, Inc., New York, NY (1983), p. 385.
IBM Technical Disclosure Bulletin, vol. 24, No. 7B, Dec. 1981, pp. 3584–3585, "Simultaneous Growth of Thick and Thin Oxide via Silicon Nitride Conversion", C. T. Kroll.
IBM Technical Disclosure Bulletin, vol. 29, No. 12, May 1987, pp. 5432–5433, "Nitride SiO$_2$ Film as a New Oxidation Mask Material".

*Primary Examiner*—Olik Chaudhuri
*Assistant Examiner*—Ourmazd Ojan
*Attorney, Agent, or Firm*—Bruce L. Adams; Van C. Wilks

[57] ABSTRACT

A method of concurrently forming thick and thin field silicon oxide films for use as element separation on the silicon substrate. An under-layer silicon oxide film is formed over the silicon substrate. A silicon nitride film is chemically-vapor-deposited over the under-layer silicon oxide film. The silicon nitride film is selectively etched to expose the under-layer silicon oxide film to thereby form openings. The silicon substrate is annealed within a heated atmosphere of ammonia gas to convert a surface portion of the exposed under-layer silicon oxide film into a thermally nitrified silicon oxide film within the openings. The thermally nitrified silicon oxide film is selectively removed from some of the openings and maintained in the other openings. The silicon substrate is thermally oxidized through the openings to concurrently form relatively thick field oxide film within said some of the openings and relatively thin field oxide film within the other openings.

15 Claims, 3 Drawing Sheets

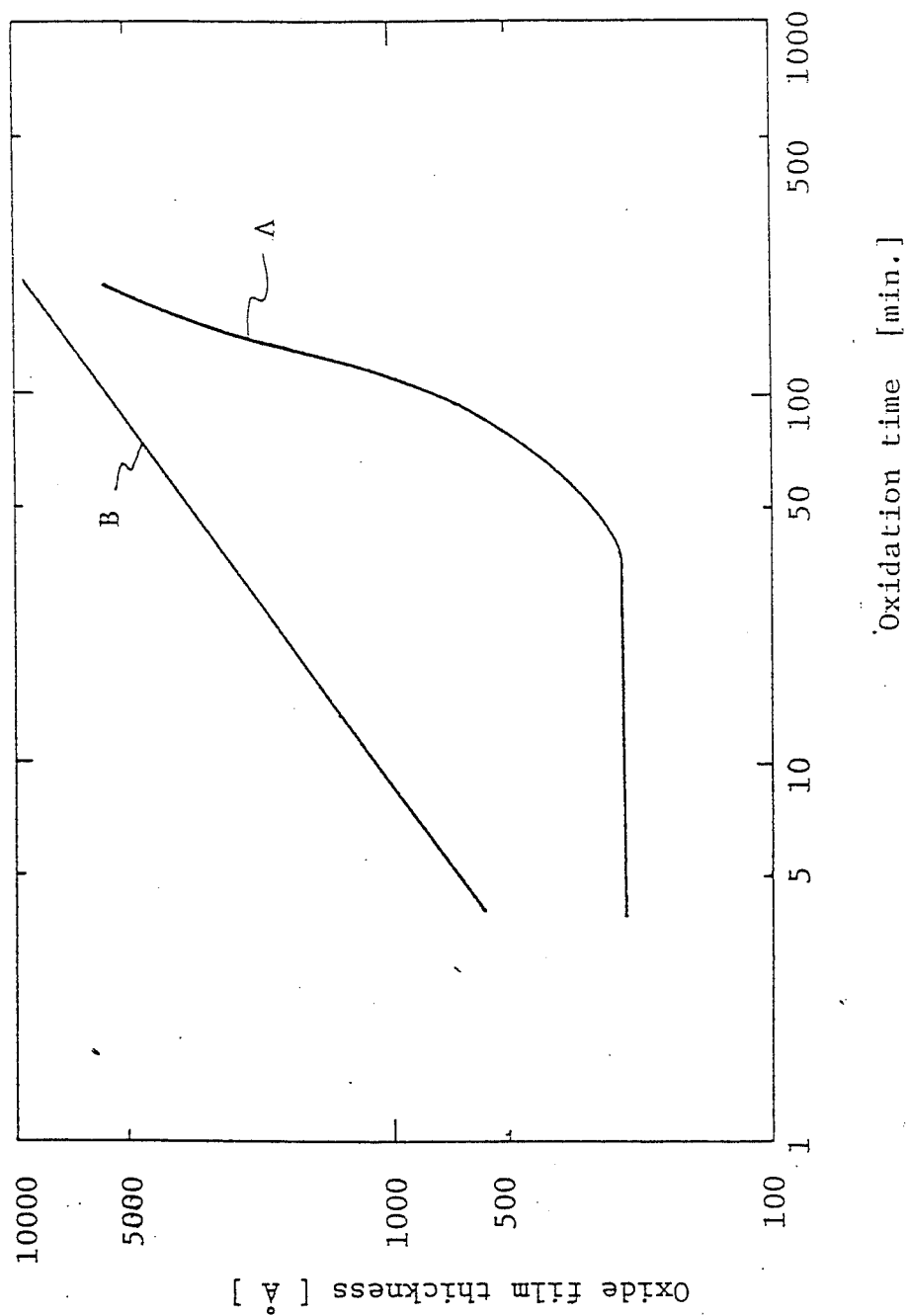

METHOD OF MAKING SEMICONDUCTOR DEVICE WITH DIFFERENT OXIDE FILM THICKNESSES

BACKGROUND OF THE INVENTION

1. Field of the Invention

The present invention relates to the method of making a semiconductor device of the type integrated with a memory array of a high voltage operation system which requires relatively thick oxide films for separation of individual memory elements (hereinafter, referred to as "thick field oxide film") so as to withstand against an applied high operating voltage, and integrated with a peripheral circuit of a low voltage operation system for driving the memory elements, which needs relatively thin oxide films for separation of individual components thereof (hereinafter, referred to as "thin field oxide film") so as to increase the integration density thereof. More specifically, the present invention relates to the method of forming thick and thin oxide films concurrently on a common semiconductor substrate of, for example, a highly integrated semiconductor nonvolatile memory device of the type described above.

2. Prior Art

The conventional method of forming field oxide films will be briefly explained with reference to FIGS. 2a–2c which show a process of forming field oxide films according to the conventional selective oxidization method (hereinafter, referred to as "LOCOS").

Referring to FIG. 2a, firstly a major surface of semiconductor substrate 1 is thermally oxidized to form an under-layer oxide film 2 (hereinafter, referred to as "PAD film").

Next referring to FIG. 2b, a nitride film 3 is formed on the PAD film 2 according to chemical-vapor-deposition (hereinafter, referred to as "CVD"), and then selectively etched according to a photolithographic process to form a mask pattern for use in the LOCOS.

Lastly, referring to FIG. 2c, the substrate 1 is subjected to thermal oxidization to form a field oxide film 7.

However, as described above, according to the conventional technology, the thickness of formed field oxide film 7 is uniform throughout the surface of substrate. Such conventional technology can not be practical to selectively form thick field oxide films on the memory array region of a semiconductor nonvolatile memory device and thin field oxide films on the peripheral circuit region of the same semiconductor nonvolatile memory device. Consequently, according to the conventional technology, the thick field oxide films would be formed on the peripheral circuit region as well as on the memory array region to thereby sacrifice the integration density of the peripheral circuit region while maintaining the electrical separation of memory elements with the thick field oxide film against the high operation voltage applied to the memory element.

SUMMARY OF THE INVENTION

In order to solve the above-mentioned problem of the conventional method, an object of the present invention is, therefore, to concurrently form thick and thin field oxide films on the substrate of semiconductor nonvolatile memory device. Another object of the present invention is to form a mask pattern film for the LOCOS process, comprised in combination of silicon nitride film formed by CVD and thermally nitrified silicon oxide film, effective to locally control the thickness of the field oxide film during the LOCOS process. A further object of the present invention is to thermally oxidize the silicon substrate surface through the combined mask pattern film to concurrently form thick and thin field oxide films on the memory array region and peripheral circuit region, respectively, of the semiconductor nonvolatile memory device so as to well-separate the individual memory elements with the thick field oxide film against the high operating voltage applied thereto, while increasing the integration density of peripheral circuit region with the thin field oxide films.

BRIEF DESCRIPTION OF THE DRAWINGS

FIG. 3 is a graph showing thermal oxidation rates of silicon substrate covered with nitrified silicon oxide film and non-covered silicon substrate.

DETAILED DESCRIPTION OF THE INVENTION

Hereinafter, preferred a embodiment of the present invention will be explained in conjunction with FIGS. 1a–1e which illustrate an improved LOCOS process according to the present invention.

Figure 1A:
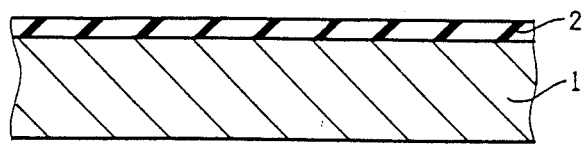
Figs. 1a–1e are process diagrams showing LOCOS process to form thick and thin field oxide films on the substrate according to the present invention.

Firstly, referring to FIG. 1a, a semiconductor substrate 1 is thermally oxidized under an atmosphere of oxygen gas held at about 900° C. to form a PAD silicon oxide film at thickness of about 250Å.

Figure 1B:
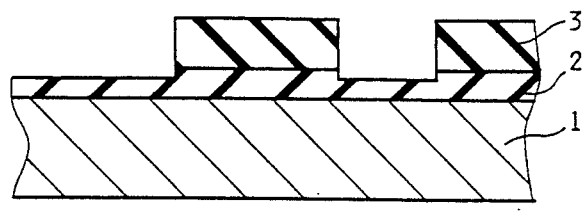

Next, referring to FIG. 1b, a silicon nitride film 3 is deposited on the PAD film 2 according to a low pressure CVD process using the gas mixture of ammonia and dichlorosilane at a thickness of about 1500Å. Then, the silicon nitride film 3 is selectively etched and removed by a photolithographic process to expose part of the PAD oxide film 2 and therefore to provide openings to which field oxide films are to be formed to thereby form a mask pattern film for the LOCOS process, having selectively etched openings.

Figure 1C:
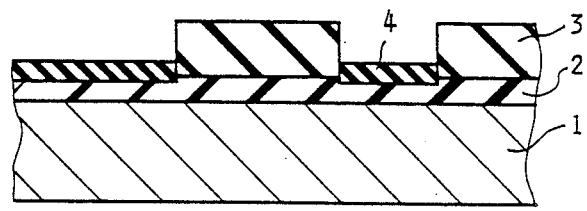

Then, referring to FIG. 1c, the substrate 1 is annealed at the high temperature of about 1000° C. for one hour within an atmosphere of dehydrated and purified ammonia gas so as to convert through the openings the composition of exposed PAD silicon oxide film 2 into thermally nitrified silicon oxide film 4 within the depth of about 50Å.

Figure 1D:
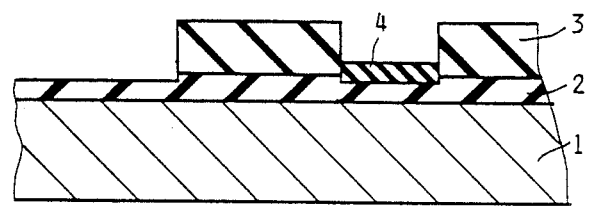

Further, referring to FIG. 1d, the thermally nitrified silicon oxide film 4 is selectively etched and removed by the photolithographic process from some of the openings to which thick field oxide films are to be formed.

Figure 1E:
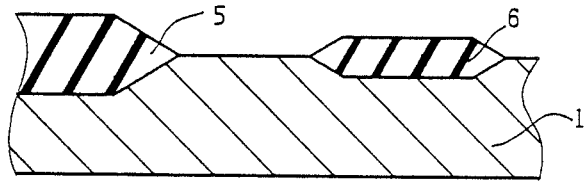
Figure 2A:
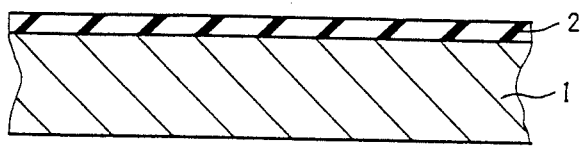
FIGS. 2a–2c are process diagrams showing the conventional LOCOS process.
Figure 2B:
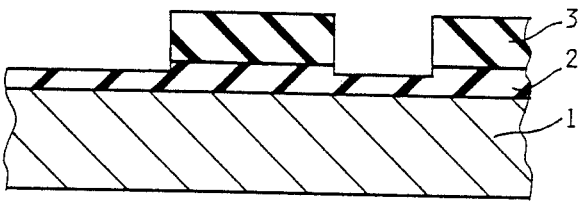
Figure 2C:
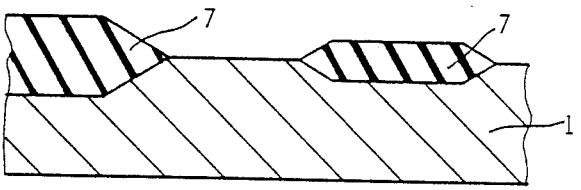

Lastly, referring to FIG. 1e, the surface portion of silicon substrate is thermally oxidized through the openings for three hours within an atmosphere of aqueous vapor held at about 1000° C. and formed by the combustion of gas mixture of oxygen and hydrogen to thereby concurrently form the thick field oxide film 5 of about 9000Å within the opening area not covered with the nitrified silicon oxide film 4 and the thin field oxide film 6 of about 5000Å within the other opening area covered with the nitride silicon oxide film 4. Thereafter, the silicon substrate is dipped into heated phosphoric acid solution to etch and remove the silicon nitride film 3 and the PAD silicon oxide film 2.

FIG. 3 shows the oxidation rates of a silicon substrate surface covered with the nitrified silicon oxide film (curve A) and a silicon substrate surface not covered with the nitrified silicon oxide film (curve B). The thermally nitrified silicon oxide film is specifically heavily nitrified in the surface and boundary portions thereof so as to efficiently block part of oxidants from reaching the boundary between the thermally nitrified silicon oxide film and the silicon substrate. For this reason, as is apparent from FIG. 3, the oxidation rate of the silicon substrate surface covered with the nitrified silicon oxide film is much smaller than that of the exposed silicon substrate surface. Accordingly, it is possible to concurrently form the thick and thin field oxide films on the same silicon substrate by the thermal oxidization process using the selectively provided nitrified silicon oxide film.

As described above, according to the present invention, by utilizing the mask pattern for the LOCOS process comprised in combination of thermally nitrified silicon oxide film and CVD silicon nitride film, thick and thin field oxide films can be selectively and concurrently formed on the memory array region and peripheral circuit region, respectively, of a semiconductor memory device. By such a method, the highly integrated nonvolatile memory device with good electrical separation can be obtained.

What is claimed is:

1. A method of forming field silicon oxide films for use as electrical separation between circuit elements integrated on a silicon substrate, the method comprising the steps of:
    forming an under-layer silicon oxide film over a silicon substrate;
    chemically-vapor-depositing a silicon nitride film over the under-layer silicon oxide film;
    selectively etching the silicon nitride film to expose the under-layer silicon oxide film to thereby form a plurality of openings in which field silicon oxide films are to be formed;
    annealing the silicon substrate within a heated atmosphere of ammonia gas to convert a surface portion of the exposed under-layer silicon oxide film into a thermally nitrified silicon oxide film within the openings;
    selectively removing the thermally nitrified silicon oxide film from some of the openings in which relatively thick field oxide film is to be formed; and
    thermally oxidizing the silicon substrate through the openings to concurrently form the relatively thick field oxide film within the other openings.

2. A method according to claim 1; wherein the step of selectively removing the thermally nitrified silicon oxide film comprises removing the thermally nitrified silicon oxide film from some of the openings located in a silicon substrate surface region in which a nonvolatile memory array is to be formed and maintaining the thermally nitrified silicon oxide film within the other openings located in another silicon substrate surface region in which a peripheral circuit for driving the memory array is to be formed.

3. A method according to claim 1; wherein the step of forming the under-layer silicon oxide film comprises thermally oxidizing the silicon substrate surface under an atmosphere of a mixture gas of ammonia and dichlorosilane under low pressure.

4. A method according to claim 1; wherein the step of chemically-vapor-depositing the silicon nitride film comprises chemically-vapor-depositing a silicon nitride film within an atmosphere of a mixture gas of ammonia and dichlorosilane under low pressure.

5. A method according to claim 1; wherein the step of thermally oxidizing the silicon substrate comprises thermally oxidizing the silicon substrate within an atmosphere of heated aqueous vapor produced by combustion of a gas mixture of oxygen and hydrogen.

6. A method according to claim 1; further comprising the step of removing the silicon nitride film and the under-layer silicon oxide film after forming the field silicon oxide films.

7. A method for electrically separating integrated circuit elements on a silicon substrate, comprising the steps of:
    forming a silicon oxide film over a silicon substrate;
    depositing a silicon nitride film over the silicon oxide film;
    removing the silicon nitride film to expose the silicon oxide film where electrical separation is desired;
    converting a surface portion of the exposed silicon oxide film into a nitrified silicon oxide film;
    selectively removing nitrified silicon oxide film to expose silicon oxide film;
    concurrently forming relatively thick field oxide film and relatively thin field oxide film on the exposed silicon oxide film and the nitrified silicon oxide film, respectively, by oxidizing the silicon substrate therethrough, whereby a relatively smaller rate of oxidation of the silicon substrate covered by the nitrified silicon oxide yields the relatively thin field oxide film and a relatively higher rate of oxidation of the silicon substrate not covered by the nitrified silicon oxide yields the relatively thick field oxide film.

8. A method according to claim 7; wherein the step of depositing comprises chemically-vapor-depositing the silicon nitride film on the silicon oxide film.

9. A method according to claim 7; wherein the step of removing the nitride film comprises selectively etching the silicon nitride film.

10. A method according to claim 7; wherein the step of converting comprises annealing the silicon substrate within a heated atmosphere of ammonia gas to form a thermally nitrified silicon oxide film.

11. A method according to claim 7; wherein the step of removing the nitrified silicon oxide film comprises removing the nitrified silicon oxide film in a region of the substrate wherein a nonvolatile memory array is to be formed and not in a region where peripheral drive circuitry is to be formed.

12. A method according to claim 7; wherein the step of forming the silicon oxide film comprises thermally oxidizing the silicon substrate surface under an atmosphere of heated oxygen gas.

13. A method according to claim 8; wherein the step of chemically-vapor-depositing the silicon nitride film comprises chemically-vapor-depositing the silicon nitride film within an atmosphere of a mixture gas of ammonia and dichlorosilane under low pressure.

14. A method according to claim 7; wherein the step of oxidizing the silicon substrate comprises thermally oxidizing the silicon substrate within an atmosphere of heated aqueous vapor produced by combustion of a gas mixture of oxygen and hydrogen.

15. A method according to claim 7; further comprising the step of removing the silicon nitride film and the silicon oxide film after forming the field oxide films.

* * * * *

UNITED STATES PATENT AND TRADEMARK OFFICE
CERTIFICATE OF CORRECTION

PATENT NO. : 4,971,923
DATED : November 20, 1990
INVENTOR(S) : Shoji NAKANISHI It is certified that error appears in the above-identified patent and that said Letters Patent is hereby corrected as shown below:

On Title page, item [30], should read

--          Foreign Application Priority Data

April 26, 1988 [JP]    Japan.............63-103414--.

Signed and Sealed this

Ninth Day of March, 1993

*Attest:*

STEPHEN G. KUNIN

*Attesting Officer*      *Acting Commissioner of Patents and Trademarks*